United States Patent Office 3,520,687
Patented July 14, 1970

3,520,687

ETCHING OF SILICON DIOXIDE BY PHOTOSENSITIVE SOLUTIONS

Donald L. Schaefer, Schenectady, N.Y., assignor to General Electric Company, a corporation of New York No Drawing. Filed May 29, 1967, Ser. No. 642,201
Int. Cl. G03c 5/00
U.S. Cl. 96—36 2 Claims

ABSTRACT OF THE DISCLOSURE

A process is disclosed whereby a surface composed of silicon dioxide is overcoated with a liquid comprising a photodecomposable fluorine compound and a source of hydrogen ions and exposed to a pattern of activating radiation while the liquid is evaporated from the surface whereby chemically reactive species are formed in the areas irradiated which preferentially etch the silicon dioxide surface in the illuminated areas. By repeating the process, the depth of etching may be controlled.

The invention herein described was made in the course of or under a contract with the Bureau of Ships, United States Navy. Attention is drawn at this point to the patent application of the instant inventor, Ser. No. 642,159, now U.S. Pat. No. 3,489,564, granted Jan. 13, 1970, entitled "Photolytic Etching of Silicon Dioxide," filed concurrently herewith and assigned to the assignee of the present invention.

BACKGROUND OF THE INVENTION

In the past when it has been desired to etch the surface of glass or quartz materials for either decorative or optical purposes, or to etch patterns through silicon dioxide surface films formed on the surfaces of so-called silicon "chips" for use as semi-conductive circuit elements in miniaturized "integrated" circuits, it has been necessary to coat those areas which are not to be etched with a protective layer of a material which is resistant to the etchant, leaving exposed those areas which are to be etched. The etchant, usually hydrofluoric acid or a solution with ammonium fluoride is then applied and etching of the surface is accomplished in those exposed areas. Where a high degree of precision is necessary in forming the etched pattern as, for example, in the manufacture of optical reticles or in the manufacture of silicon chips, it has been conventional to use a suitable "photoresist" process. In general, these processes have involved coating the surface to be etched with a material which, when suitably irradiated, is converted from a soluble to an insoluble material. In practice, the surface to be etched is coated with the material, exposed to the desired pattern of activating radiation through an appropriate photographic negative, for example, and the unexposed still soluble areas of the coating removing by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and the etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants employed in the etching of silicon dioxide are toxic and in the case of hydrofluoric acid, extremely dangerous to use. It would be advantageous to eliminate the necessity for the use of the photoresist material, the multiple step process attendant therewith and the use of the hazardous etchants.

It is therefore a principal object of this invention to provide a process for etching predetermined patterns in surfaces composed essentially of silicon dioxide which does not require the use of a mask of the photoresist type or the use of etchants containing hydrofluoric acid.

It is a further object of this invention to provide a method for the selective etching of a silicon dioxide surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of surfaces composed primarily of silicon dioxide by covering said surfaces with a thin film of a liquid which contains a source of hydrogen ions and which is photodecomposable to form species which are chemically reactive with said surface, thereby forming an interface between said surface and said liquid film, exposing said interface to a pattern of activating radiation through said liquid film while causing said liquid to evaporate whereby said chemically reactive species formed in the liquid film are concentrated at the interface in the illuminated areas and react with said surface to etch said pattern into said surface, the rate of reaction being dependent at least in part to the degree of concentration of the reactive species which is dependent in part upon the intensity of the radiation in any given point at the interface.

DESCRIPTION OF THE PREFERRED EMBODIMENTS

More particularly, the following examples illustrate how the invention may be practiced.

A silicon chip of semiconductor quality measuring about 1 inch by 1 inch and about 0.060 inch in thickness and having one surface oxidized to provide a layer of silicon dioxide about 6000 A. in thickness was supported in an open top container with the oxidized surface uppermost and horizontal. The surface of the chip was submerged under a liquid composed of 1-fluorodecane and exposed through the liquid to a pattern of illumination from a 150 watt high pressure xenon lamp for several hours without any evidence of etching. A 1000 watt H6 mercury lamp was substituted as a source of radiation and the liquid permitted to completely evaporate during exposure. After an exposure of four hours under these conditions, no etching was observed. A liquid consisting of 1-fluorodecane containing about 50 percent concentrated hydrochloric acid was substituted for the pure 1-fluorodecane and permitted to evaporate during exposure and the silicon dioxide coating was found to have been etched through about 6000 A. in those areas exposed to the activating radiation.

From this, it was concluded that a ready source of hydrogen ions must be available to react in some way with the photolytically derived species produced by the action of the radiation upon the fluorine containing compounds in order to produce a significant degree of etching. Accordingly, when the foregoing procedure was repeated with the following listed etchants, i.e. exposure to a radiation pattern from the 1000 watt mercury lamp with simultaneous evaporation of the liquid etchant, significant etching in those areas of the silicon dioxide coating of similar chip was observed. In these examples, when a solvent is used, the fluorine compound is present in amounts up to the limit of solubility.

LIQUID ETCHANTS

| Fluorine compound | Solvent | Source of hydrogen ion |
|---|---|---|
| Fluorosulfonyl benzene sulfonyl chloride. | Methanol | Conc. HCl (10%). |
| Monofluoroacetone | Water | Conc. HCl (10%). |
| 4,4'-fluorobenzophenone | Methanol | Conc. HCl (10%). |
| Methane sulfonyl fluoride | Water | Conc. HCl (10%). |
| 1-fluoro-2-propanol | | 2-propanol (50%). |
| Hexafluorobenzene | | Cyclohexane (50%). |
| Trityldifluoroamine | Methanol | Conc. HCl (10%). |
| Fluoranil | do | Conc. HCl (10%). |

From the foregoing, it will be observed that the source of hydrogen ions may be an acid or an organic compound which provides a ready source of hydrogen ions. Further, in order to produce efficient etching, the thickness of the liquid layer through which the activating radiation is projected is important. It is postulated that in layers of liquid etchant greater than about 2 mm. in thickness, the chemically reactive species produced by the radiation either recombine before they can reach the liquid-solid interface or are consumed in competing side reactions and produce no etching. While the foregoing disclosure has described a procedure in which the etchant has been completely evaporated during exposure to the radiation pattern, significant etching occurs before the surface becomes completely dry. Yet further, the bond dissociation energy of the fluorine bond of the photo-decomposable fluorine containing compound should be less than about 125 kilocalories per mole for efficient etching.

It will be obvious to those skilled in the art that if a greater depth of etching of the silicon dioxide surface than can be achieved with a single exposure and evaporation step is desired, successive films of liquid etchant may be applied to the surface without disturbing the relationship of the surface to the radiation pattern and the depth of etching progressively increased.

From the foregoing, it will be appreciated that the several liquid systems which are photodecomposable to produce chemically reactive species which etch silicon dioxide are to be considered exemplary only and it is not intended that the scope of the invention be limited thereto or in any other manner except as set forth in the following claims.

What I claim as new and desire to secure by Letters Patent of the United States is:

1. In a method for photoetching a surface composed primarily of silicon dioxide, the steps of contacting said surface with a thin film of a liquid etchant containing a dissociable fluorine containing compound and a source of hydrogen ions, wherein said compound comprises a photodecomposable compound in which the fluorine bond having a dissociation energy of not more than 125 kilocalories per mole, said liquid etchant being photodecomposable to produce chemically reactive species which chemically attack silicon dioxide, and exposing the surface of said film to a pattern of activating radiation to produce said chemically reactive species at the liquid to solid interface, and reducing the thickness of the liquid film by evaporation during the exposure step to concentrate said reacted species at the interface whereby said surface is etched in the irradiated areas.

2. The method of claim 1 wherein said film is less than about 2 millimeters in thickness.

References Cited

UNITED STATES PATENTS

| | | | |
|---|---|---|---|
| 2,804,388 | 8/1957 | Marron et al. | 96—36 X |
| 2,841,477 | 7/1958 | Hall | 204—157.1 X |
| 2,875,046 | 2/1959 | Marron et al. | 96—36 X |
| 3,095,332 | 6/1963 | Ligenza | 156—17 X |
| 3,095,341 | 6/1963 | Ligenza | 156—17 |
| 3,122,463 | 2/1964 | Ligenza et al. | 156—4 |
| 3,255,005 | 6/1966 | Green | 96—36 |
| 3,271,180 | 9/1966 | White | 96—36 X |
| 3,346,384 | 10/1967 | Gaynor | 96—36 |

GEORGE F. LESMES, Primary Examiner

R. E. MARTIN, Assistant Examiner

U.S. Cl. X.R.

96—36.2